(12) United States Patent
Thilderkvist et al.

(10) Patent No.: US 6,277,194 B1
(45) Date of Patent: Aug. 21, 2001

(54) METHOD FOR IN-SITU CLEANING OF SURFACES IN A SUBSTRATE PROCESSING CHAMBER

(75) Inventors: AnnaLena Thilderkvist, Sunnyvale; Paul B. Comita, Menlo Park; Ann P. Waldhauer, La Honda, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/422,877

(22) Filed: Oct. 21, 1999

(51) Int. Cl.[7] ................................................. C30B 25/18
(52) U.S. Cl. ............................. 117/94; 117/95; 438/694; 134/1.3; 216/37
(58) Field of Search ....................... 107/94, 95; 438/694; 216/37; 134/1.3

(56) References Cited

U.S. PATENT DOCUMENTS

| | | | |
|---|---|---|---|
| 5,444,001 | * | 8/1995 | Tokuyama .............................. 438/695 |
| 5,725,677 | * | 3/1998 | Sugino et al. ............................ 134/1 |
| 5,789,030 | * | 8/1998 | Rolfson ................................. 427/309 |
| 5,849,102 | * | 12/1998 | Okonogi ................................. 134/19 |

FOREIGN PATENT DOCUMENTS

| | | | |
|---|---|---|---|
| 5-036653 | * | 2/1995 | (JP) .......................................... 134/1 |
| 7-037893 | * | 2/1995 | (JP) .......................................... 134/1 |

* cited by examiner

*Primary Examiner*—Robert Kunemund
(74) *Attorney, Agent, or Firm*—Blakely Sokoloff Taylor & Zafman (57) ABSTRACT

A method of removing contaminants from a surface in a silicon substrate processing chamber. The method includes coating the surface which has been exposed to contaminants including metal particles with a material preferably including silicon. During coating, contaminants are collected by the material being applied. The method further includes removing the material and any contaminants that have been collected by the material during coating. The method can be performed after the surface has been exposed to contaminants from ambient air or moisture during cleaning or preventive maintenance procedures, for example. Also, the method is preferably performed before any baking procedures or before the chamber is heated to drive out any moisture that has been introduced to the chamber.

38 Claims, 6 Drawing Sheets

METHOD FOR IN-SITU CLEANING OF SURFACES IN A SUBSTRATE PROCESSING CHAMBER

FIELD OF THE INVENTION

The invention relates generally to silicon substrate processing and, more particularly, to a method for removing contaminants from surfaces in silicon substrate processing chambers.

BACKGROUND OF THE INVENTION

An important step in the process of integrated circuit manufacturing is the processing of the semiconductor substrate in which active devices such as transistors and capacitors that comprise the integrated circuits are formed. The silicon substrate, known as a wafer, must be manufactured to extremely precise specifications and quality standards. As in any manufacturing industry, minimization of defects is an important consideration. Because the active devices that are formed on the silicon substrate are microscopic in size, any defect in the substrate, even on the molecular or atomic level, will decrease yield and therefore increase the cost of manufacturing integrated circuits.

In an effort to minimize defects in silicon substrates, great care is taken to provide an extremely clean and controlled environment throughout the processing of the substrates. Toward this end, the processing chamber is periodically cleaned by opening the chamber, and chamber parts are either cleaned and reinstalled or replaced. This preventive maintenance can expose the surfaces of the process chamber to ambient air and moisture, which can be sources of metal contamination. Also, in the case of an epitaxial silicon or polysilicon deposition chamber (epi or poly chamber), the chamber and platform surfaces are periodically "etched" to remove excess silicon that has accumulated during previous cycles of silicon deposition.

Defects in the wafer can occur as a result of contaminants such as metal particles being transferred to the wafer during handling of the wafer or during processing of the wafer. Metal impurities in contact with the wafer can then diffuse into the bulk of the wafer during high temperature processing. Such contaminants can later change the electrical properties of a device manufactured in the wafer, thus causing a faulty integrated circuit. The impurities can act as recombination centers and traps for electrons and holes and can have a great effect on leakage currents. Typically, the impurities are metals such as iron, nickel, cobalt, and copper.

During high temperature processing, metal impurities can diffuse through the crystalline structure of the silicon material into the bulk of the wafer. The migration of metal impurities through the silicon lattice structure of a semiconductor wafer depends on the solubility and diffusivity of the various metals. Solubility is a measure of the maximum impurity concentration which can be dissolved in thermal equilibrium in a sample at a given temperature. If the impurity concentration is higher than its solubility, the material is super-saturated. Diffusivity is a measure of how fast the impurity diffuses through the lattice at a certain temperature.

Processing at high temperatures causes high solubility of metal impurities. The solubility decreases during cool down. The behavior of the impurities during cool down depends heavily on their diffusion properties. For example, impurities with low diffusivity can be quenched-in as metastable, electrically active point defects in the bulk of the material during a relatively fast decrease in temperature.

Impurities with high diffusivity and high solubility (copper, cobalt, and nickel, for example) are called haze metals because they diffuse to the surface during cool down and form surface precipitates. Impurities with low diffusivity might not be able to reach the surface during cool down. Instead they form precipitates within the bulk of the wafer or are trapped in the silicon lattice as point defects.

Iron, nickel, copper, and cobalt, can all easily diffuse through the thickness of a wafer at temperatures higher than 1,000 C. Most of these metals can diffuse on the order of millimeters or centimeters during a one minute process at such high temperatures.

Figure 1:
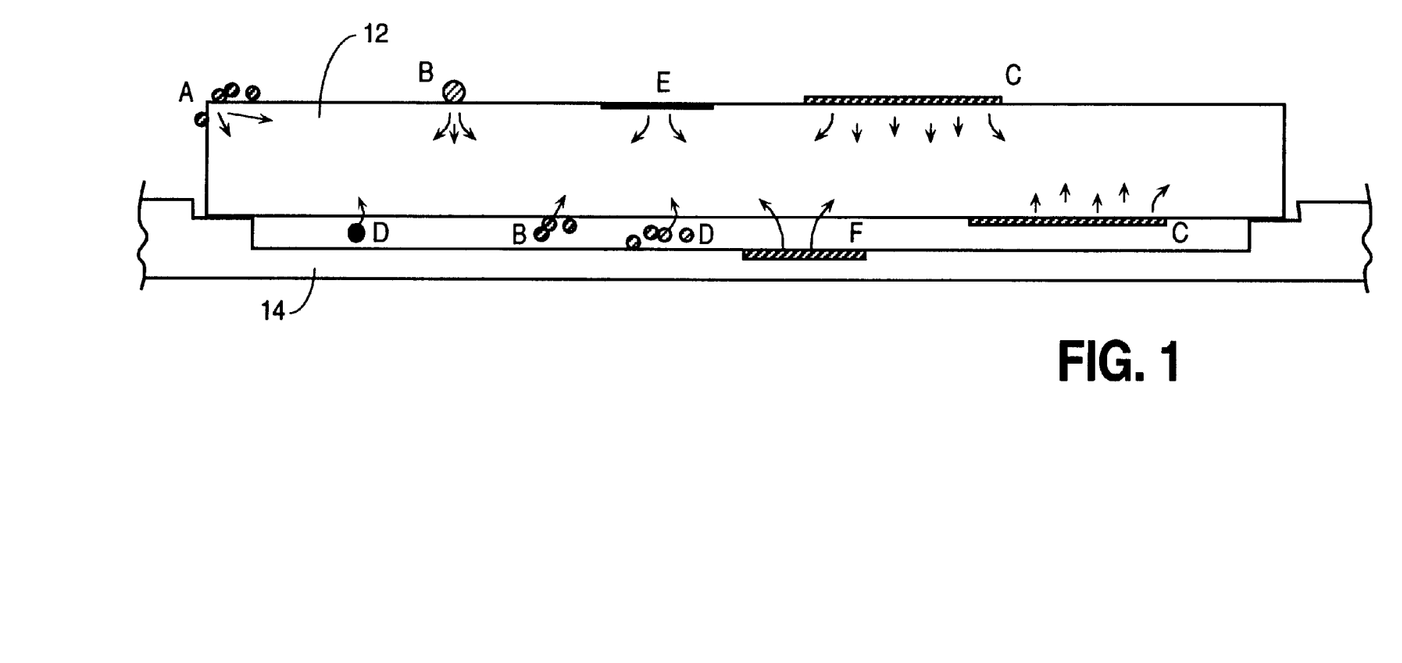
FIG. 1 is a cross sectional view of a silicon substrate on a platform showing examples of various presentations of contaminant particles.

FIG. 1 shows examples of metal contamination on a silicon wafer 12 that is resting on a susceptor 14. Example A of FIG. 1 shows particles on the edge of the wafer 12 that may have been transferred from a contaminated container or wafer carrier such as a wafer box or load lock cassette. Example B of FIG. 1 shows particles on the wafer surface that can be transferred to the wafer from tools such as robot arms, vacuum tweezers, metrology tool chucks, or even from ambient air. Example C of FIG. 1 shows homogeneous surface contamination due to wet cleaning with contaminated chemicals. Example D of FIG. 1 shows particles on the susceptor present before installation or from contaminated wafers that have been previously processed on the susceptor. Examples E and F of FIG. 1 show metal silicides formed on the wafer surface (E) or susceptor surface (F) during heat treatment. Each of Examples A through F shows metal contamination that can diffuse into the bulk of the wafer at high processing temperatures, as illustrated by the arrows in FIG. 1.

A number of sources of contamination are possible. For example, direct contact between the silicon wafer and metal parts can transfer metal particles to the wafer. Chucks, tweezers, wands, robots, and general improper handling can result in direct contact of metal to the silicon wafer. Another possible source is a contaminated cleaning solution. Metal atoms with higher electronegativity than silicon and which are present in the cleaning solution or on the cleaning vessel will segregate on the wafer surface. Such metals could be iron (Fe), cobalt (Co), nickel (Ni), copper (Cu), molybdenum (Mo), silver (Ag), platinum (Pt), gold (Au), and mercury (Hg), for example. At lower temperatures, the metals can evaporate from the wafer. At higher temperatures, however, it is more common to find metal silicides which act as a contamination source. At very high temperatures, the metals can diffuse into the bulk of the wafer.

It is highly desirable to avoid the introduction of metal contaminants into silicon processing chambers. In many cases, however, some metal contamination is unavoidable. This is especially true in the case of preventive maintenance or during installation of new parts in a processing chamber when the chamber is exposed to ambient air or moisture. New parts can have metal contaminant residual from machining or coating steps in the hardware manufacturing process. In situations where a processing chamber has been exposed to metal contaminants that can potentially be transferred to silicon substrates, it is desirable to remove as many contaminating particles from the chamber as possible before processing of production wafers begins. Current methods of cleaning processing chambers to minimize metal contamination of wafers require significant "down time" of the processing chamber. Also, current methods can have high material or operating costs (e.g. processing of "dummy" wafers and baking procedures) in addition to the lost costs of the chamber that is temporarily out of service.

SUMMARY OF THE INVENTION

A method of removing contaminants from a surface in a silicon substrate processing chamber is described. In one embodiment, the method includes coating the surface with a layer of material such that the contaminants are collected by the layer of material. The method further includes removing at least a portion of the layer of material together with at least a portion of the contaminants contained within the layer of material.

BRIEF DESCRIPTION OF THE DRAWINGS

The present invention is illustrated by way of example, and not limitation, in the figures of the accompanying drawings in which.

DETAILED DESCRIPTION

The present invention is a method of removing contaminants from a surface in a silicon substrate processing chamber. The method can be used to remove contaminants such as metal particles from the surfaces of parts in a processing chamber such as a susceptor, wafer lift pins, or any other surfaces that will be in either direct or close contact with the wafer during processing, for example. The term "surface" is to be understood to include a portion of the component below the outer surface because, as shown in FIG. 1, contaminants can be present within the material of the processing chamber component. The term "substrate" should be understood to be interchangeable with "wafer" for the purpose of this description.

In general, removal of contaminants is desirable because contaminants that are on the parts of a processing chamber, such as a susceptor or a lift pin, can be transferred to a substrate that rests on the susceptor during processing. Contaminants in a substrate cause defects and reduce yields. One type of chamber in which the method can be performed is a chemical vapor deposition (CVD) chamber for depositing epitaxial silicon or polysilicon. The method can prolong the life of silicon carbide (SiC) coated parts, for example, by removing metal contaminants which can cause pin-holes and other defects in the SiC coating.

One example of the method includes coating a surface that has been exposed to contaminants with a material including silicon. During coating, contaminants on or in the surface of the chamber parts are collected by the material deposited at high temperature during coating. The material, along with the collected contaminants, is then removed from the surface.

Preferably, the material applied during coating is polycrystalline or amorphous silicon. Other materials that can be used are silicon germanium (SiGe), silicon germanium carbide (SiGeC), silicon carbide (SiC), or other similar materials. The method is preferably performed before the components of the chamber are heated for any extended period of time after exposure to contaminants as, for example, during a chamber preventive maintenance procedure. For example, the method can be the first procedure performed during the process of "recovery" of the chamber, as described below.

Figure 2:
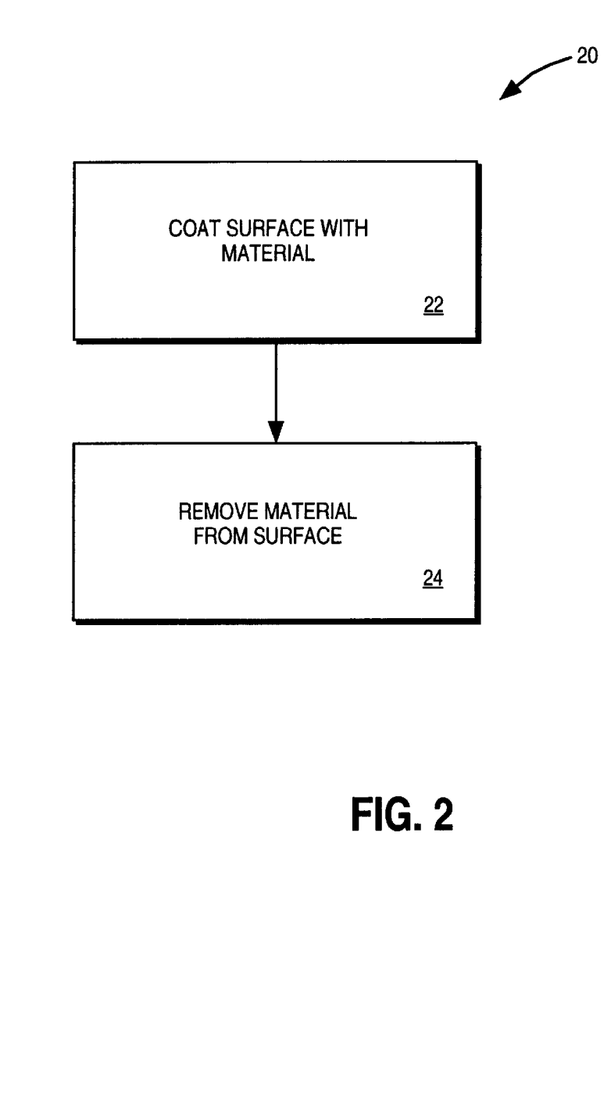
FIG. 2 is a flowchart showing an example of the method in accordance with the present invention.

FIG. 2 shows an example of the method 20 of the present invention wherein a surface (such as on a susceptor) of a silicon substrate processing chamber is prepared by coating 22 the surface with a material and removing 24 the material from the surface. Preferably, the material includes silicon.

According to the method, the coating 22 of the surface with a layer of material is preferably performed before the chamber is heated to high temperature. Also, the coating can be performed after a known contamination has occurred.

During the coating 22 of the surface, contaminants are collected by the layer of material. Contaminants on the surface, including below the surface, can be collected by diffusion into the material that is being deposited onto the surface under high temperature conditions. Contaminants can also be collected when the material applied during coating 22 traps contaminants that are on the surface by covering, surrounding, or enveloping the contaminants. It should be noted that the term "collected" refers to diffusion, trapping, or any other mechanism by which contaminants become associated with the material applied during coating such that the contaminants are removed when the material is removed.

The coating 22 and removing 24 of the material from the surface can be performed much more quickly than current bake and process procedures, and thus can significantly decrease the amount of time required to prepare the chamber for production processing. For example, the coating 22 and removing 24 can take about 30 minutes, whereas current recovery procedures can take three to ten or more hours.

The method also decreases the amount of defects on silicon substrates due to contaminated chamber surfaces. The coating 22 and removing 24 of the material decreases the amount of metal contamination on the surface. Consequently, the amount of metal contamination transferred from the surface to the substrate during high temperature processing can be substantially decreased. As the amount of contamination is decreased, it is believed that the amount of defects is decreased.

Figure 3A:
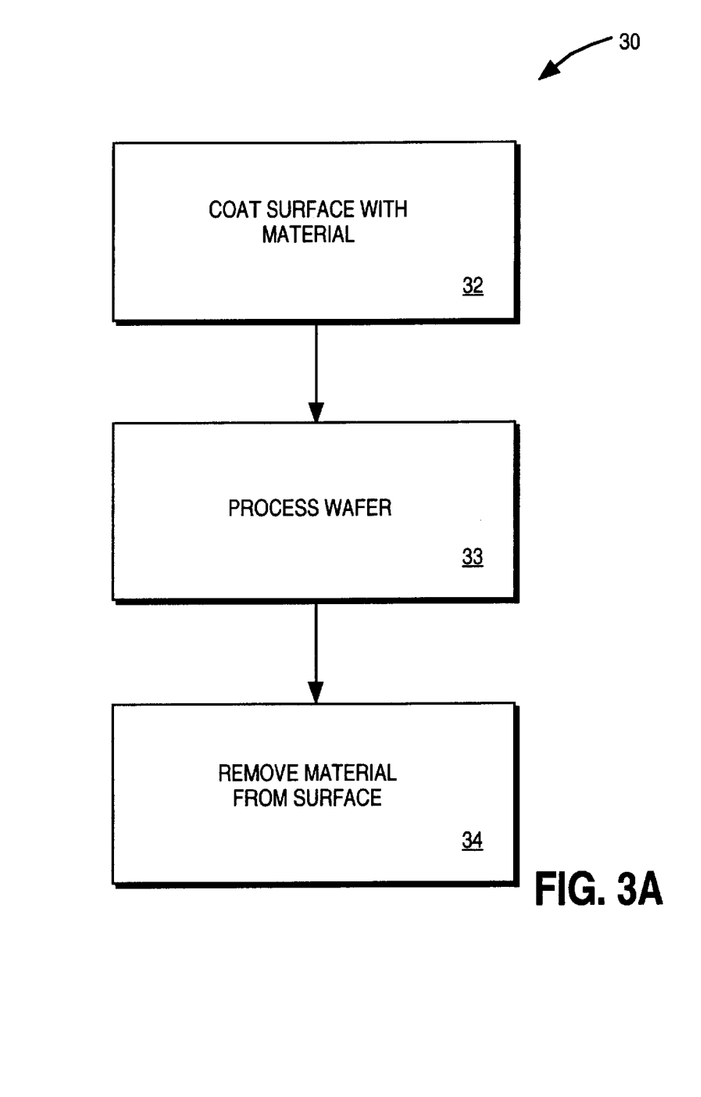
FIG. 3A is a flowchart showing an alternate example of the method in accordance with the present invention.

FIG. 3A shows an alternative example of a method 30 of the present invention wherein a surface of a silicon substrate processing chamber is prepared by coating 32 the surface with a material including silicon, processing 33 a wafer, and removing 34 the material including silicon from the surface. This procedure can be repeated continuously during production, or alternatively, multiple wafers can be processed between coating 32 and removing 34.

Figure 3B:
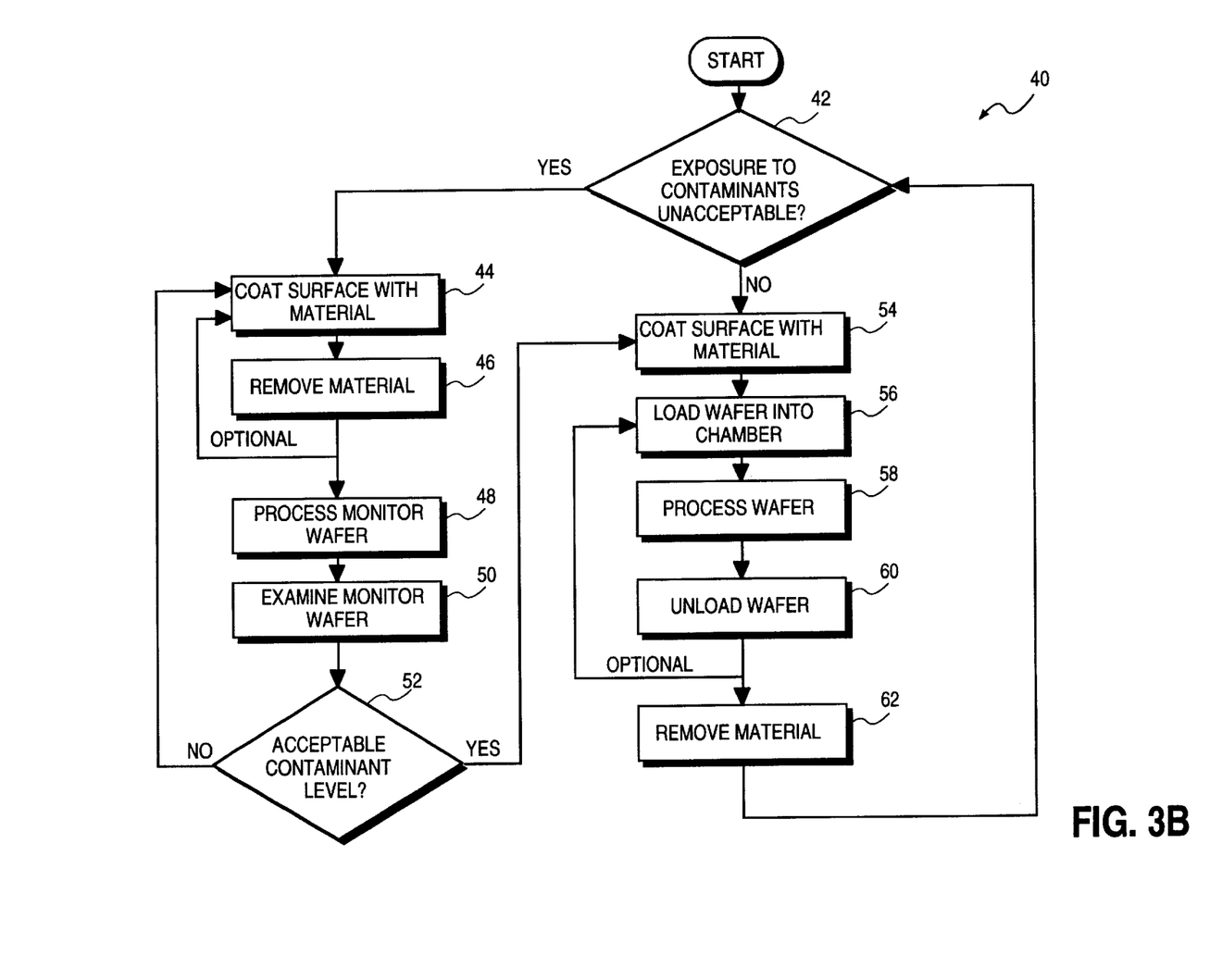
FIG. 3B is a flowchart showing another alternate example of the method in accordance with the present invention.

FIG. 3B shows another example of a method 40 of the present invention wherein the method of removing contaminants from a surface in a silicon substrate processing chamber is illustrated as it might be incorporated into the processing of production wafers. After determining 42 that the processing chamber has been exposed to contamination, the processing chamber is prepared by coating 44 the surface of the processing chamber with a material that preferably includes silicon. During coating 44, contaminants are collected by the material applied. The method further includes removing 46 the material such that the contaminants that have been collected by the material during coating 44 are removed from the processing chamber surface. In some situations, such as after exposure to an unusually high level of contamination, coating 44 and removing 46 can be repeated one or more times.

The method can further include processing 48 and examining 50 a monitor wafer to determine the extent to which contaminants have been removed during coating 44 and removing 46 of the material. Examining 50 of the monitor wafer is performed for determining 52 whether the level or amount of contamination remaining on the processing chamber surface is acceptable for production.

If the coating 44 and removing 46 results in a low enough contamination level, the chamber is ready for production. The production process can include another coating 54 of the surface with material in preparation for processing 58 of the production wafer. After coating 54 of the surface, the method of FIG. 3B can include loading 56 a production wafer into the processing chamber. The method further includes processing 58 the production wafer and unloading 60 the production wafer after processing 58. Loading 56, processing 58, and unloading 60 can be repeated. For example, the loading 56, processing 58, and unloading 60, can be repeated multiple times before removing 62 the material applied during coating 54. Of course, the number of times the method is repeated can depend on a variety of manufacturing factors, such as the level of contamination that is acceptable. Since it is less likely that processing 58 of production wafers will introduce contaminants into the processing chamber, multiple wafers can be processed before the coating and removing are performed again in order to remove contaminants.

If desired, the coating 44 and removing 46 of the material for the purpose of removing contaminants can be performed routinely between a selected number of production processing cycles. Since the coating and removing is a relatively fast way of cleaning contaminants from the chamber surfaces, the method can be easily incorporated into the production process such that it is not necessary to periodically examine a production wafer for contaminants during the normal production run. Of course, once the chamber is opened, such as for preventive maintenance, or at any other time at which the chamber is known to be contaminated, the coating 44 and removing 46 of the material can be performed to clean the chamber. In such a case, it may still be desirable to process 48 a monitor wafer and then examine 50 it for contaminants before putting the chamber back into production.

Referring again to FIGS. 2 through 3B, the method can be performed in a variety of ways. For example, the coating and removing procedures can be repeated any number of times. Also, the method can be performed at least once between every wafer processed in production, to provide continuous "cleaning" by coating and removing after each processed wafer.

Alternatively, the coating can be performed and the material can be left on the susceptor during the processing of a wafer. The material applied during coating can then serve as a barrier between the susceptor and the wafer to reduce the amount of contamination transfer from the susceptor to the process wafer during processing. In this case, removing the material applied during coating can be performed after the wafer is processed. Alternatively, multiple wafers can be processed between removing and coating.

The method can be performed when a new susceptor is installed in an epi chamber. The method is performed as the first high temperature step, i.e. before the chamber has been exposed to high temperature or hydrogen chloride (HCl) gas. Examples of high temperature steps that need to be performed before production are temperature calibration or emissivity matching. After these high temperature steps, the previously applied material can be removed, and the removing can be followed by coating the susceptor. The removing and coating can be performed an additional 2–10 times depending on contamination level. The first wafer is then processed and can be checked for contamination to verify that the chamber is ready for production. After verifying that the chamber is ready, production wafers can be processed. After each of the subsequent wafers, removal of material from the previous coating followed by new coating can be performed.

Figure 4:
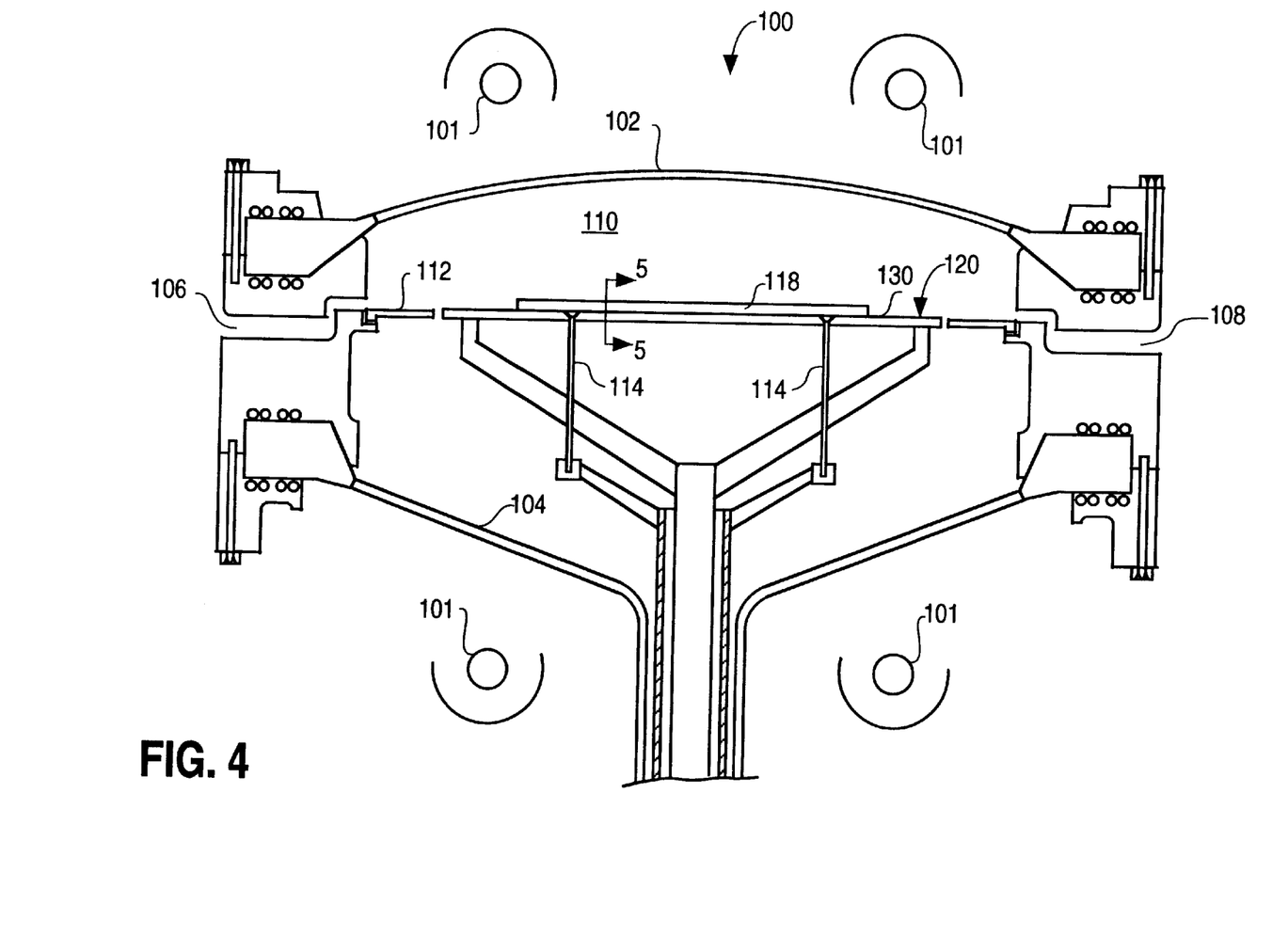
FIG. 4 is a cross sectional, side elevational view of a substrate processing chamber including a platform and a substrate resting on a platform.

FIG. 4 shows one example of a silicon substrate processing chamber 100 in which the method of the present invention can be performed. The silicon substrate processing chamber 100 shown in FIG. 4 can be an atmospheric chamber for depositing epitaxial silicon on a wafer (epi chamber), for example. Chamber 100 includes a top cover 102 and a bottom cover 104. Top cover 102 and bottom cover 104 are typically translucent or transparent to heat energy provided by heat sources 101 that are located above and below chamber 100. Chamber 100 includes inlet 106 and outlet 108 for supplying and removing gases for processing of the silicon substrate 118. Also, during processing, various atmospheric conditions (such as a vacuum or a pressurized atmosphere) can be created in the interior 110 of chamber 100.

While FIG. 4 shows a processing chamber 100 in which a single susceptor is included, chamber 100 should be understood to be an exemplary chamber for purposes of illustration herein. The method of the present invention can be performed in a variety of chamber configurations including, for example, a multiple wafer processing chamber such as a barrel or pancake reactor that includes a batch susceptor for holding several wafers simultaneously.

The silicon substrate 118 is placed onto platform 120 in the processing chamber 100. Platform 120 has a top surface 130 on which silicon substrate 118 rests. Platform 120 can be rotatable or vertically movable. Also, platform 120 can include a recess or pocket into which the substrate 118 can be placed.

In an epi chamber, the platform is known as a susceptor. A typical susceptor is a heat-conducting body of graphite that is coated with silicon carbide (SiC). The susceptor can alternatively be a solid SiC platform. The susceptor or platform 120 typically holds the silicon substrate 118 horizontally. During processing, the susceptor absorbs heat from the heat sources 101 and provides a heated support for the substrate 118. The susceptor is preferably designed to provide relatively even heating across the bottom surface of the substrate 118.

The susceptor is typically the main carrier of metal contamination that can be transferred to the wafer. It has been observed that a new susceptor can actually transfer more contaminants than a used one. Generally, metal particles can be introduced onto the susceptor surface during the manufacturing and packaging processes of the susceptor parts, as well as from metal parts or tools that contact the susceptor during fabrication or handling. Also, metal particles can be introduced to the susceptor surface from wafers that are handled by other pieces of machinery such as a loading blade. Since the loading blade contacts the wafer during loading and aligning, metal particles that may be present on the surface of the blade can be transferred from the blade to the wafer and then to the susceptor surface from the wafer. Subsequent wafers can then pick up the metal particles from the susceptor surface.

Processing chamber 100 can also include other components or parts that can be carriers or sources of metal contamination. The processing chamber can include lift pins 114 that are elongated vertical pins that extend through the susceptor 120 and are movable vertically to lift substrate 118 from susceptor 120 by contacting the substrate 118 on its bottom surface. Lift pins 114 can contact substrate 118 at locations that are inward from the edge of substrate 118 as shown in FIG. 4, or lift pins 114 can contact substrate 118 at its peripheral edge. In either case, contaminants that are present on the contact surfaces of lift pins 114 can be transferred to substrate 118.

Another possible carrier or source of metal contamination is a preheat ring 112, which is typically a flat annular ring that surrounds susceptor 120. Preheat ring 112 is typically made of SiC coated graphite, which is similar to a typical susceptor 120, or preheat ring 112 can be solid SiC. Lift pins 114 are typically made of SiC, but can also be made of quartz, which can be coated with SiC. While the method of the present invention can be performed on any of the parts or components of the processing chamber, the susceptor is described herein as the exemplary part that is cleaned. The invention is not limited, however, to cleaning susceptors.

The substrate 118 (commonly referred to as a "wafer") is typically a base material such as monocrystalline silicon, for example. During processing of the substrate 118, silicon is deposited onto the base material in an epi chamber to create epitaxial silicon layers.

Silicon substrate 118 is loaded into the processing chamber 100 through an opening (not shown) that is preferably designed such that any atmospheric condition or vacuum existing in the interior 110 of the processing chamber 100 is maintained during loading or unloading of the substrate 118. Thus, a controlled and clean environment can be maintained in the interior 110 of the processing chamber 100. Nevertheless, processing chamber 100 must periodically be opened for preventive maintenance, which includes cleaning of the interior surfaces and parts. Preventive maintenance can also include replacing worn or consumed parts, such as the susceptor, pre-heat ring, lift pins, susceptor shafts, etc. Susceptors, for example, are typically replaced rather than wet cleaned. During preventive maintenance, top cover 102 can be removed or opened to provide access to the interior 110 of the processing chamber 100. When the chamber 100 is opened, the interior can be exposed to ambient air or moisture. Thus, contaminants can be introduced to the surfaces of the chamber.

Any moisture or contaminants introduced during cleaning or preventive maintenance processes must be removed from the chamber 100 before any production substrates 118 are processed. Generally, the chamber including the susceptor is baked to drive out such moisture. A ramped bake procedure, which is a heating of the interior of the chamber at temperatures up to 1200 C. for approximately 1 to 2 hours, is typically performed to drive out moisture from the parts in the chamber in order to prevent corrosion of metal parts. Contact of HCl or water ($H_2O$) on metal can accelerate corrosion, e.g. $Fe_2O_3$ formation. Introduction of a reactant such as trichlorosilane ($SiHCl_3$) or other silanes during the performance of the method of the present invention can remove $H_2O$ by direct chemical reaction, preventing this corrosion process.

One undesirable effect of the bake procedure is to diffuse any metal particles that are on surface 130 of platform 120 further into the SiC coating of the platform 120, thus forming metal silicides on platform 120. The metal silicides can then act as a continuous source of metal contamination that will diffuse into the wafers during processing.

Before the chamber is ready for production after having been opened to the atmosphere, a procedure known as "recovery" is generally performed in an effort to reduce contaminants in the chamber. Recovery typically serves to reduce the metal contamination present in the chamber on the susceptor surface. The recovery process typically includes baking the chamber and cycling a number of "dummy" wafers through the epi chamber before processing actual production wafers. The dummy wafers are for the purpose of reducing the amount of contaminants on the susceptor by letting the contaminants diffuse into the dummy wafers during cycling at high temperatures. It has been observed that after a number of dummy wafers are processed, the susceptor and chamber exhibit lower contaminant levels. The susceptor and chamber are then ready to process production wafers once the metal concentrations are deemed low enough to be acceptable.

During one example of a recovery process, the bake is followed by processing of 25 to 50 wafers, which can take more than three hours. It may be necessary to process up to about 50 dummy wafers before metal contamination levels are low enough for production. The bake and dummy wafer cycling procedures together can take more than four hours.

The use of a series of dummy wafers after every preventive maintenance routine, however, is time consuming and costly because the dummy wafers, having picked up contaminants from the susceptor, must then be discarded. Also, each dummy wafer cycle takes the same amount of time as a production wafer processing cycle.

Another problem associated with the use of dummy wafers is that the dummy wafers themselves can introduce contaminants to the susceptor which are then transferred to production wafers during processing. This problem can occur when "dirty" dummy wafers are reused. Ideally, dummy wafers are used once and then discarded; a costly procedure. The use of dummy wafers during recovery is even less desirable when the larger and more costly 300 millimeter diameter wafers are used. Since the industry is currently moving toward the use of the larger 300 millimeter diameter wafers, a method of removing contaminants from the epi chamber after preventive maintenance that requires very few or no wasted dummy wafers is desirable. Decreased recovery time is desirable because the epi chamber can be placed back into service more quickly after preventive maintenance.

Moreover, the metal contaminants in the SiC coating of the susceptor are more readily diffused into the material (preferably silicon) applied during coating of the surface than into a wafer. The material applied during coating of the surface has a much closer contact to the surface of the susceptor than the wafer that is placed on the surface of the susceptor. The diffusion of metal contaminants from the susceptor into the material applied during coating is much easier compared to diffusion of contaminants into a wafer because there is a small gap between the surface of the susceptor and the wafer. In the method of the present invention, the material applied during coating of the surface is applied at very high temperature and in gaseous form which allows the material to cover the surface of the susceptor much more closely than would a wafer that simply rests on the surface.

Figure 5:
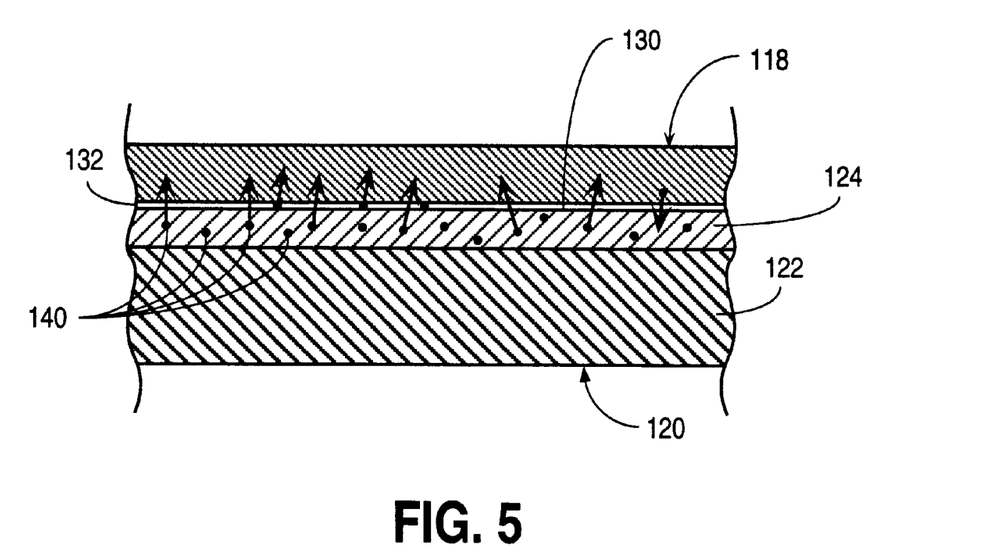
FIG. 5 is an enlarged cross sectional view of the platform and substrate of FIG. 4 taken along line 5—5 of FIG. 4.

FIG. 5 is an enlarged partial cross sectional view of platform 120. In the example shown in FIG. 5, the platform 120 includes a base 122 and a covering layer 124. When platform 120 is a susceptor, the base 122 is typically made of graphite, and the covering layer 124 is typically a layer of SiC. The platform can alternatively be made of solid SiC. Also, the susceptor discussed with reference to FIGS. 5–10 is only an example of one of the surfaces to which the method of the present invention can be applied. Examples of other surfaces include the preheat ring and lift pins. Also, other surfaces can be made of other materials, such as quartz.

In FIG. 5, substrate 118 is shown resting on the top 130 of platform 120. There is a slight gap 132 between the top 130 and substrate 118. Contaminants are represented as particles 140 on the surface of platform 120. It should be noted that contamination is not always particulate. As illustrated in FIG. 1, the contamination can be in the form of a film on the surface, for example. As shown in FIG. 5, particles 140 can be located on the top 130 and also within covering layer 124 near the top 130. For the purposes of this patent, the surface includes the top 130 and a portion of covering layer 124 in which particles 140 are present. If platform 120 does not include a covering layer 124, it should be understood that the surface of the platform includes a portion of the platform material immediately below the top 130 for purposes of the method described herein. It should also be understood that the term "particles" is used herein for simplicity of description. The arrows in FIG. 5 indicate that particles 140 can diffuse or migrate into substrate 118 during processing.

Figure 6:
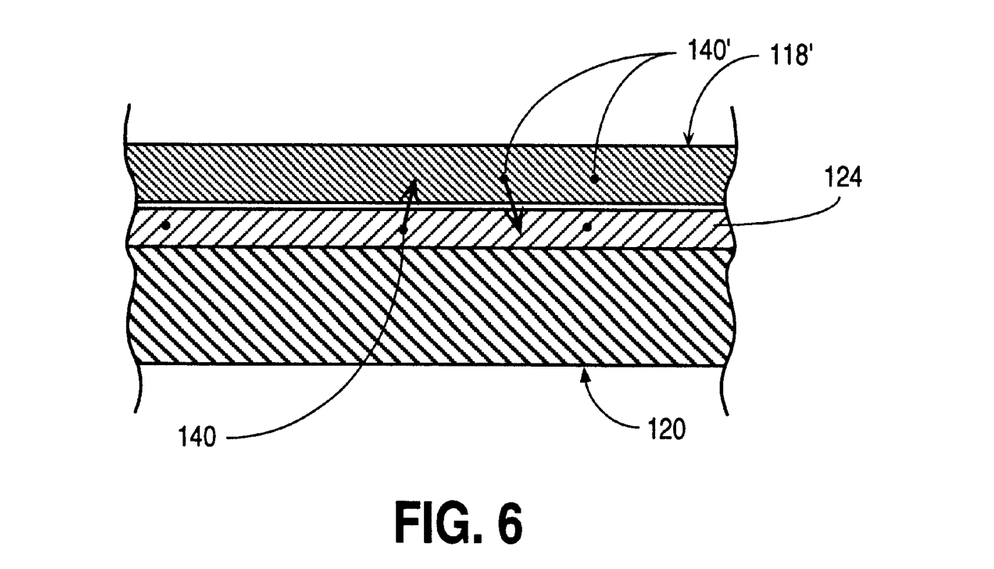
FIG. 6 is an enlarged cross sectional view of the platform taken along line 5—5 of FIG. 4.

FIGS. 5 and 6 show that the amount of contamination, illustrated for convenience as particles 140, decreases as subsequent substrates 118' are processed. For example, FIG. 6 shows a decreased number of particles 140 in layer 124 that can diffuse into a subsequent substrate 118'. This is typical of a recovery process wherein a series of "dummy" wafers are used after preventive maintenance has been performed or the surface has been exposed to contaminants. FIG. 6 also illustrates the case wherein substrate 118' is a dirty dummy wafer. Substrate 118' can include particles 140' that can diffuse into layer 124 of platform 120.

Figure 7:
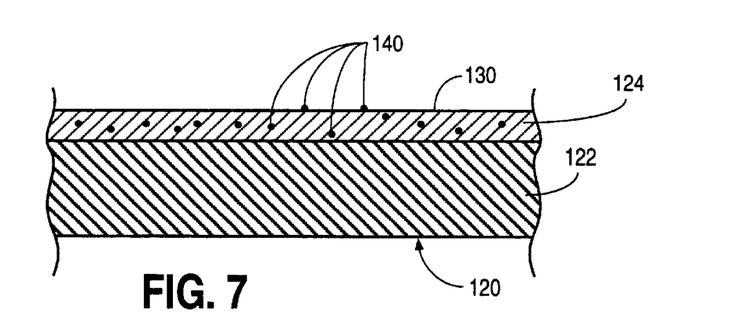
FIG. 7 is an enlarged cross sectional view of the platform taken along line 5—5 of FIG. 4.

FIGS. 7 through 10 show a method of removing contaminants from the surface of the platform 120 of the silicon substrate processing chamber. FIG. 7 shows a platform 120 including a base 122 and a covering layer 124 wherein platform 120 has been exposed to contaminants. Consequently, particles 140 are present on covering layer 124 and on top 130. Particles 140 can potentially cause defects in wafers or substrates (not shown) should the platform 120 be used for production in its current state.

Figure 8:
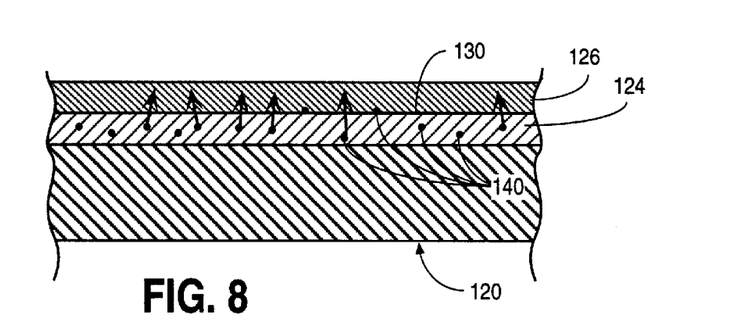
FIG. 8 is an enlarged cross sectional view of the platform taken along line 5—5 of FIG. 4.

FIG. 8 shows a layer 126 of material that has been applied onto top 130 of platform 120. Layer 126 is preferably a material including silicon and can be polycrystalline or amorphous silicon. During the application of layer 126, particles 140 are collected by layer 126. Particles 140 can diffuse into layer 126 during the high temperature process of applying layer 126.

Coating of the platform 120 is preferably performed at temperatures greater than about 1000 C. Also, the amount of time during which coating of the platform is performed can vary. Preferably, coating takes more than about 50 seconds. The amount of time allowed for coating is preferably adequate to allow a more than minimal amount of metal contamination to be collected by the material being applied. The time for coating can be selected based on other factors including, for example, the number of coating and removing cycles to be performed, temperature, and time for each cycle. A longer coating time may result in a thicker coat and better removal of metal particles, but slows down the preparation of the chamber. It should be noted that recipes or times and temperatures described herein are generally for a single wafer susceptor. Different sizes or configurations of processing chambers may require different process conditions to achieve a desired thickness.

Coating of the susceptor or platform 120 with the layer 126 of material can be done using procedures similar to those used for growing epitaxial silicon layers on a silicon wafer. An exemplary recipe that can be used for the method calls for flowing about 5–15 standard liters per minute (slm) of trichlorosilane (TCS) mixed with about 30–60 slm of hydrogen ($H_2$) at a temperature of about 1130° C. for about 85 seconds. Generally, this method can be performed at atmospheric pressure (about 760 Torr), but need not be. Preferably, the coating includes flowing about 11 standard liters per minute (slm) of trichlorosilane (TCS) mixed with about 55 slm of hydrogen ($H_2$) to the chamber at a temperature of about 1130 degrees Celsius (C.) and a pressure of about 760 Torr (T) for about 85 seconds. If the method is performed at a lower pressure, such as 100 Torr, a recipe is used that calls for flowing about 0.6 slm of dichlorosiline (DCS) mixed with 15–45 slm of $H_2$ to the chamber at a temperature of about 1100° C. for about 120 seconds.

Preferably, a thickness of material is applied by using a recipe that would provide at least about a 3 micron ($\mu$m) thick layer of epitaxial silicon on a wafer. It is currently impractical to measure the thickness of material applied to a susceptor without performing a destructive test. Therefore, a recipe that results in a known thickness on a wafer is used with the assumption that a similar thickness will result on the susceptor surface.

Figure 9:
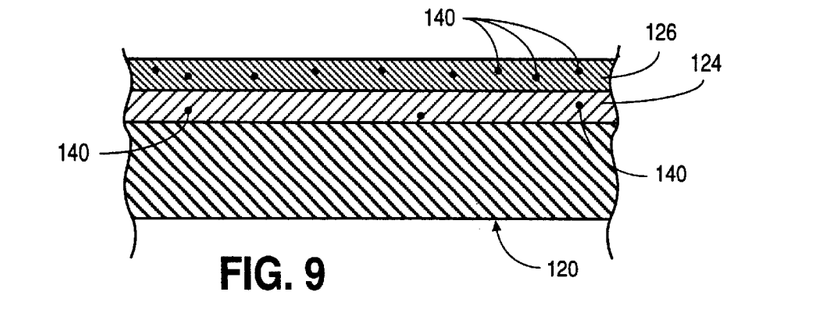
FIG. 9 is an enlarged cross sectional view of the platform taken along line 5—5 of FIG. 4.

FIG. 9 shows platform 120 with layer 126 of material on covering layer 124. FIG. 9 shows particles 140 that have been collected by layer 126 from covering layer 124. The particles 140 in layer 126 may have been trapped, migrated or diffused into layer 126. As shown in FIG. 9, the number of particles 140 (i.e. the amount of contamination) in covering layer 124 is decreased compared to FIG. 7.

Figure 10:
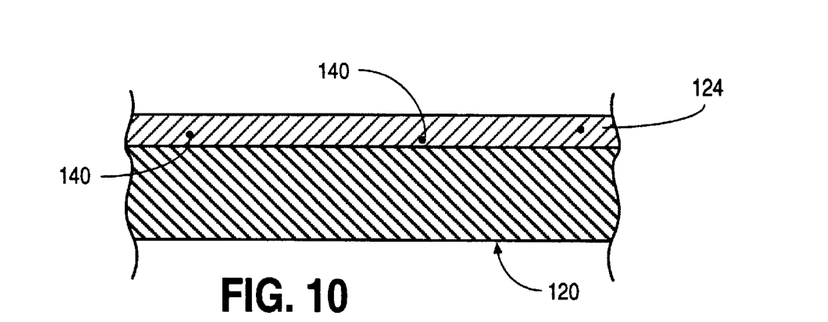
FIG. 10 is an enlarged cross sectional view of the platform taken along line 5—5 of FIG. 4.

The method of preparing the surface further includes removing the layer 126 after particles 140 have been collected. The removing of the layer 126 can be performed by etching the layer 126. An exemplary etching recipe calls for flowing about 15 slm of hydrochloric acid (HCl) at about 1190 C. for about 65 seconds through the chamber. Preferably, etching with HCl should be performed after coating of the surface with layer 126 to avoid HCl reacting directly with metal particles. Other chemical etchants or recipes can also be used. FIG. 10 illustrates platform 120 after layer 126 has been removed from the platform 120 shown in FIG. 9. A decreased number of particles 140 remain in covering layer 124.

It is believed that repeating the coating and removing procedures several times results in removing a larger amount of contamination from covering layer 124. If repeated a sufficient number of times (3–10, for example), the coating and removing removes enough contamination from the chamber parts that the use of dummy wafers can be significantly decreased or eliminated entirely, thus reducing the cost and time necessary to bring the processing chamber into production after the interior surfaces have been exposed to contaminants.

The method described and shown in the figures can be used in the processing of a silicon substrate such as a semiconductor wafer. The susceptor surface of the substrate processing chamber can be prepared after the susceptor surface has been exposed to contamination during a procedure such as preventive maintenance. The preparing of the susceptor surface can include coating the surface with a material including silicon, such as either polysilicon or amorphous silicon. The coating can be performed at a temperature of at least about 1000 C. such that at least a portion of the metal contamination diffuses into the material from the susceptor surface. The preparing of the susceptor surface can further include removing the material and the portion of the plurality of metal particles that have diffused into the material. The preparation of the susceptor surface using the method of the present invention reduces the amount of metal contaminants that can cause defects in production silicon substrates.

A method of preparing a surface in a silicon substrate processing chamber has been described. The present invention has been described with reference to exemplary embodiments. It is also important to note that the present invention is not limited to the preparation of epi or polysilicon chambers for production. The invention may be used in other types of substrate processing chambers. Accordingly, the specification and drawings are to be regarded in an illustrative rather than a restrictive sense.

What is claimed is:

1. A method of removing contaminants from a silicon carbide surface, the silicon carbide surface being part of a silicon substrate processing chamber, the method comprising:
   coating said surface with a layer of material such that said contaminants are collected by said layer of material; and
   removing at least a portion of said layer of material together with at least a portion of said contaminants contained within said layer of material.

2. The method of claim 1 wherein said coating and said removing are repeated before a first substrate is processed in the processing chamber.

3. The method of claim 1 wherein said coating and said removing are repeated after a silicon substrate is processed in the processing chamber.

4. The method of claim 1 wherein said coating is performed before a silicon substrate is processed.

5. The method of claim 4 wherein said removing is performed after said silicon substrate is processed.

6. The method of claim 1 wherein said layer of material includes polysilicon.

7. The method of claim 1 wherein said layer of material includes amorphous silicon.

8. The method of claim 1 wherein said layer of material includes silicon germanium (SiGe).

9. The method of claim 1 wherein said layer of material includes silicon germanium carbide (SiGiC).

10. The method of claim 1 wherein said layer of material includes silicon carbide (SiC).

11. The method of claim 1 wherein said coating includes flowing about 11 standard liters per minute (slm) of trichlorosilane (TCS) mixed with about 55 slm of hydrogen ($H_2$) to the chamber at a temperature of about 1130 degrees Celsius (C.) and a pressure of about 760 Torr (T) for about 85 seconds.

12. The method of claim 1 wherein said coating includes flowing about 0.6 slm of dichlorosiline (DCS) mixed with 15–45 slm of hydrogen ($H_2$) to the chamber at a temperature of about 1100 degrees Celsius (C.) and a pressure of about 100 Torr (T) for about 120 seconds.

13. The method of claim 1 wherein said removing said material includes applying hydrochloric acid (HCl) at about 1190 C. for about 65 seconds.

14. A method of preparing a silicon carbide (SiC) surface, the silicon carbide surface being part of a silicon substrate processing chamber, said method comprising:
   exposing said surface to contaminants;
   coating said surface with a layer of material including silicon; and
   removing at least a portion of said layer of material from said surface.

15. The method of claim 14 wherein said coating is performed before said surface has been heated without said layer of material.

16. The method of claim 14 wherein said coating and said removing are repeated after a silicon substrate is processed in the processing chamber.

17. The method of claim 14 wherein said coating is performed before a silicon substrate is processed in said chamber.

18. The method of claim 17 wherein said removing is performed after said silicon substrate is processed in said chamber.

19. The method of claim 14 wherein said coating is performed such that at least a portion of said contaminants on said surface are collected by said layer of material.

20. The method of claim 19 wherein said removing of said portion of said layer of material includes removing said contaminants that have been collected by said layer of material.

21. The method of claim 19 wherein said coating is performed at a temperature of at least about 1000 degrees Celsius (C.).

22. The method of claim 19 wherein said coating is performed for at least about 50 seconds.

23. The method of claim 19 wherein said contaminants are metals selected from the group consisting of iron (Fe), nickel (Ni), cobalt (Co), titanium (Ti), copper (Cu), chromium (Cr), and zinc (Zn).

24. The method of claim 14 wherein said surface is on a processing chamber component selected from the group consisting of a susceptor, a preheat ring, and a lift pin.

25. The method of claim 14 wherein said SiC surface includes a layer of SiC disposed on a graphite base.

26. A method of preparing a silicon substrate processing chamber, the method comprising:
   coating a silicon carbide surface of the processing chamber having metal contaminants therein, said coating including applying a material at a selected temperature for a selected period of time such that said contaminants present in said silicon carbide surface are collected by said material, wherein said coating is performed before a first silicon substrate is processed; and
   removing said material including said contaminants that have been collected by said material.

27. The method of claim 26 wherein said selected temperature is at least about 1000 degrees Celsius (C.).

28. The method of claim 25 wherein said selected period of time is at least about 50 seconds.

29. The method of claim 26 wherein said coating is performed after the processing chamber has been exposed to moisture and before the processing chamber is heated in order to drive out said moisture.

30. The method of claim 26 wherein said first silicon substrate is a semiconductor wafer, and said coating is performed before said silicon substrate is processed in a temperature of at least about 500 degrees Celsius (C.).

31. The method of claim 26 wherein said coating is repeated before a second silicon substrate is processed.

32. A method of processing a silicon substrate, said method comprising:

preparing a susceptor surface in a substrate processing chamber after said susceptor surface has been exposed to contaminants such that said contaminants are present on said susceptor surface, wherein said preparing includes coating said surface with a material including silicon, said coating being performed at a temperature of at least about 1000 degrees Celsius (C.) such that at least a portion of said contaminants are collected by said material from said susceptor surface, said preparing further including removing said material and said portion of said contaminants that have been collected by said material;

placing said silicon substrate on said susceptor surface for processing; and processing said silicon substrate.

33. The method of claim 32 wherein said processing includes depositing epitaxial layers of silicon on said silicon substrate.

34. The method of claim 32 wherein said processing is performed after said coating and before said removing.

35. The method of claim 1 wherein said layer of material includes silicon and has a thickness of at least about three (3) microns.

36. The method of claim 14 wherein said layer of material has a thickness of at least about three (3) microns.

37. The method of claim 26 wherein said material applied to said silicon carbide surface includes silicon and has a thickness of at least about three (3) microns.

38. The method of claim 33 wherein said material including silicon has a thickness of at least about three (3) microns.

* * * * *